United States Patent
Sasao et al.

(10) Patent No.: US 11,177,129 B2
(45) Date of Patent: Nov. 16, 2021

(54) METHOD OF MANUFACTURING SEMICONDUCTOR DEVICE, METHOD OF FORMING PATTERN FILM, AND METAL-CONTAINING ORGANIC FILM

(71) Applicant: TOSHIBA MEMORY CORPORATION, Tokyo (JP)

(72) Inventors: Norikatsu Sasao, Kawasaki Kanagawa (JP); Koji Asakawa, Kawasaki Kanagawa (JP); Shinobu Sugimura, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 62 days.

(21) Appl. No.: 16/562,709

(22) Filed: Sep. 6, 2019

(65) Prior Publication Data

US 2020/0294795 A1  Sep. 17, 2020

(30) Foreign Application Priority Data

Mar. 14, 2019 (JP) .............................. JP2019-047601

(51) Int. Cl.
*H01L 21/027* (2006.01)
*H01L 21/02* (2006.01)
(Continued)

(52) U.S. Cl.
CPC ........ *H01L 21/0271* (2013.01); *C08F 220/44* (2013.01); *H01L 21/02118* (2013.01);
(Continued)

(58) Field of Classification Search
CPC ......... H01L 21/31058; H01L 21/02282; H01L 21/0271–0279; C09D 153/00–025; C08F 220/44–50
See application file for complete search history.

(56) References Cited

U.S. PATENT DOCUMENTS 5,079,600 A * 1/1992 Schnur ................... B05D 1/185
257/629
6,921,623 B2 7/2005 Hanabata et al.
(Continued)

FOREIGN PATENT DOCUMENTS

CN 105126917 A 12/2015
JP 60-226582 A 11/1985
(Continued)

OTHER PUBLICATIONS

Tseng et al. "Enhanced Lithographic Imaging Layer Meets Semiconductor Manufacturing Specification a Decade Early", Advanced Materials, 24, 2608-2613 (Year: 2012).*
(Continued)

*Primary Examiner* — Errol V Fernandes
*Assistant Examiner* — Jeremy J Joy
(74) *Attorney, Agent, or Firm* — Finnegan, Henderson, Farabow, Garrett & Dunner L.L.P.

(57) ABSTRACT

According to one embodiment, a method of manufacturing a semiconductor device is disclosed. The method of manufacturing a semiconductor device, includes forming an organic film containing polyacrylonitrile on a target film on a semiconductor substrate; applying a metal compound to the organic film to form a composite film; removing the composite film partially to form a pattern; heating the pattern-formed composite film; and processing the target film by using the heated composite film as a mask.

25 Claims, 5 Drawing Sheets

(51) Int. Cl.
  *H01L 21/3105* (2006.01)
  *H01L 21/311* (2006.01)
  *C08F 220/44* (2006.01)
  *H01L 27/11556* (2017.01)
  *H01L 27/11582* (2017.01)

(52) U.S. Cl.
  CPC .. *H01L 21/02282* (2013.01); *H01L 21/31058* (2013.01); *H01L 21/31116* (2013.01); *H01L 21/31144* (2013.01); *C08F 2800/20* (2013.01); *C08F 2810/00* (2013.01); *H01L 27/11556* (2013.01); *H01L 27/11582* (2013.01)

(56) References Cited

U.S. PATENT DOCUMENTS

| | | | | |
|---|---|---|---|---|
| 7,033,648 | B1* | 4/2006 | Doany | C23C 18/1605 216/65 |
| 9,123,658 | B2* | 9/2015 | Abdallah | H01L 21/3065 |
| 9,329,483 | B2* | 5/2016 | Iwao | G03F 7/168 |
| 9,487,600 | B2* | 11/2016 | Darling | H01L 51/4213 |
| 9,876,022 | B1* | 1/2018 | Hasegawa | H01L 29/40117 |
| 11,022,879 | B2* | 6/2021 | Maes | G03F 7/70808 |
| 2006/0183834 | A1* | 8/2006 | Kuwahara | C08F 20/44 524/401 |
| 2009/0075087 | A1* | 3/2009 | Xu | B81C 1/00801 428/413 |
| 2012/0228262 | A1* | 9/2012 | Tanaka | G11B 5/82 216/49 |
| 2015/0225850 | A1* | 8/2015 | Arora | H01L 21/0335 216/51 |
| 2016/0035577 | A1* | 2/2016 | Lei | B23K 26/40 438/462 |
| 2016/0049292 | A1* | 2/2016 | Yaegashi | G03F 7/20 438/781 |
| 2016/0251546 | A1* | 9/2016 | Nakajima | C09D 183/04 438/695 |
| 2016/0284560 | A1* | 9/2016 | Hieno | G03F 7/0035 |
| 2017/0282127 | A1* | 10/2017 | Yang | B01D 67/0034 |
| 2017/0343896 | A1* | 11/2017 | Darling | H01L 21/3065 |
| 2018/0138048 | A1* | 5/2018 | Sawabe | B81C 1/00436 |
| 2018/0374695 | A1* | 12/2018 | Yamada | H01L 21/0273 |
| 2019/0080887 | A1* | 3/2019 | Saito | G03F 7/168 |
| 2019/0121232 | A1* | 4/2019 | Sawabe | H01L 21/31058 |
| 2019/0206136 | A1* | 7/2019 | West | G06F 3/16 |
| 2019/0345300 | A1* | 11/2019 | Ryu | C08F 220/44 |
| 2020/0285148 | A1* | 9/2020 | Nam | C23C 16/407 |

FOREIGN PATENT DOCUMENTS

| | | |
|---|---|---|
| JP | 2001-310331 A | 11/2001 |
| JP | 2002-287339 A | 10/2002 |
| JP | 2014-120620 A | 6/2014 |

OTHER PUBLICATIONS

Elam et al. "New Insights into Sequential Infiltration Synthesis", ECS Transactions, 69 (7) 147-157 (Year: 2015).*

Tseng et al. "Enhanced polymeric lithography resists via sequential infiltration synthesis", Journal of Materials Chemistry, 21, 11722-11725 (Year: 2011).*

Tseng et al. "Etch properties of resists modified by sequential infiltration synthesis", Journal of Vacuum Science & Technology B, 29, 06FG01 (Year: 2011).*

Biswas et al., "New Insight into the Mechanism of Sequential Infiltration Synthesis from Infrared Spectroscopy," Chemistry of Materials, vol. 26 , pp. 6135-6141 (2014).

* cited by examiner

METHOD OF MANUFACTURING SEMICONDUCTOR DEVICE, METHOD OF FORMING PATTERN FILM, AND METAL-CONTAINING ORGANIC FILM

CROSS-REFERENCE TO RELATED APPLICATIONS

This application is based upon and claims the benefit of priority from Japanese Patent Application No. 2019-047601 filed on Mar. 14, 2019; the entire contents of all of which are incorporated herein by reference.

FIELD

Embodiments described herein relate generally to a method of manufacturing a semiconductor device, a method of forming a pattern film, and a metal-containing organic film.

BACKGROUND

In a manufacturing process of a semiconductor device, there is increasing demand for a technology forming a pattern with a high aspect ratio. A mask pattern used for such a process requires high etch resistance because it is exposed to etching gas for a long time.

DETAILED DESCRIPTION

According to one embodiment, a method of manufacturing a semiconductor device is disclosed. The method of manufacturing a semiconductor device, includes forming an organic film containing polyacrylonitrile on a target film on a semiconductor substrate; applying a metal compound to the organic film to form a composite film; removing the composite film partially to form a pattern; heating the pattern-formed composite film; and processing the target film by using the heated composite film as a mask.

According to another embodiment, a method of forming a pattern film is disclosed. The method of forming a pattern film, includes forming an organic film containing polyacrylonitrile; applying a metal compound to the organic film to form a composite film; removing the composite film partially to form a pattern; and heating the pattern-formed composite film.

According to another embodiment, a metal-containing organic film is disclosed. The metal-containing organic film contains a structure in which a cyano group of polyacrylonitrile is cyclized and a metal compound is coordinated to nitrogen atoms of the cyclized cyano group.

Hereinafter, the present invention will be explained in detail with reference to the drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing therein above are marked with like reference numerals, and a detailed description is omitted as appropriate.

Components in the embodiments include ones which can be easily imagined by the person skilled in the art. Components in the embodiments also include ones which are substantially the same.

A polymer is formed by polymerization of monomers and the polymer consists of repeating units derived from the monomers. In this document, the repeating unit composing the polymer is referred to as a monomer unit. The monomer unit is a unit derived from the monomer, and a component monomer of the monomer unit is a monomer forming the monomer unit by polymerization. A monomer unit represented by a chemical formula (1) in the specification is also referred to as a monomer unit (1). Also in the case of a monomer unit and a compound represented by another chemical formula, the monomer unit and the compound are sometimes represented by marks of the chemical formula.

A block unit in the specification is a block in which two or more of the same monomer units are repeated continuously in a polymer. A block unit of polyacrylonitrile is a block in which two or more monomer units with acrylonitrile set to a component monomer are repeated continuously.

In consideration of the above-described requirement, the present inventors have found that a mask pattern having high etch-resistance with high accuracy in dimensions can be obtained by forming an organic film containing polyacrylonitrile, patterning a composite film obtained by infiltration of a metal compound into the organic film, and heating the composite film. Here, infiltration of a metal compound into an organic film is referred to as "metallization." The metallization includes a method of directly applying and infiltrating a metal compound into an organic film and a method of infiltrating a precursor (a precursor of a metal compound that is present in a composite film eventually) into an organic film and converting the precursor into a metal compound present in a composite film after oxidation or the like, for example.

The method of manufacturing the semiconductor device in the embodiment includes the following steps of (A) to (E).
(A) A step of forming an organic film containing polyacrylonitrile on a target film on a semiconductor substrate, (to be also referred to as an (A) step or an organic film forming step, hereinafter)
(B) A step of applying a metal compound to the organic film obtained after the (A) step to form a composite film (to be also referred to as a (B) step or a metallization step, hereinafter)
(C) A step of partially removing the composite film obtained after the (B) step to form a pattern (to be also referred to as a (C) step or a patterning step, hereinafter)
(D) A step of heating the pattern-formed composite film (to be also referred to as a (D) step or a heating step, hereinafter)

(E) A step of processing the target film by using the heated composite film obtained after the (D) step as a mask (to be also referred to as an (E) step or a target film processing step)

Figure 1:
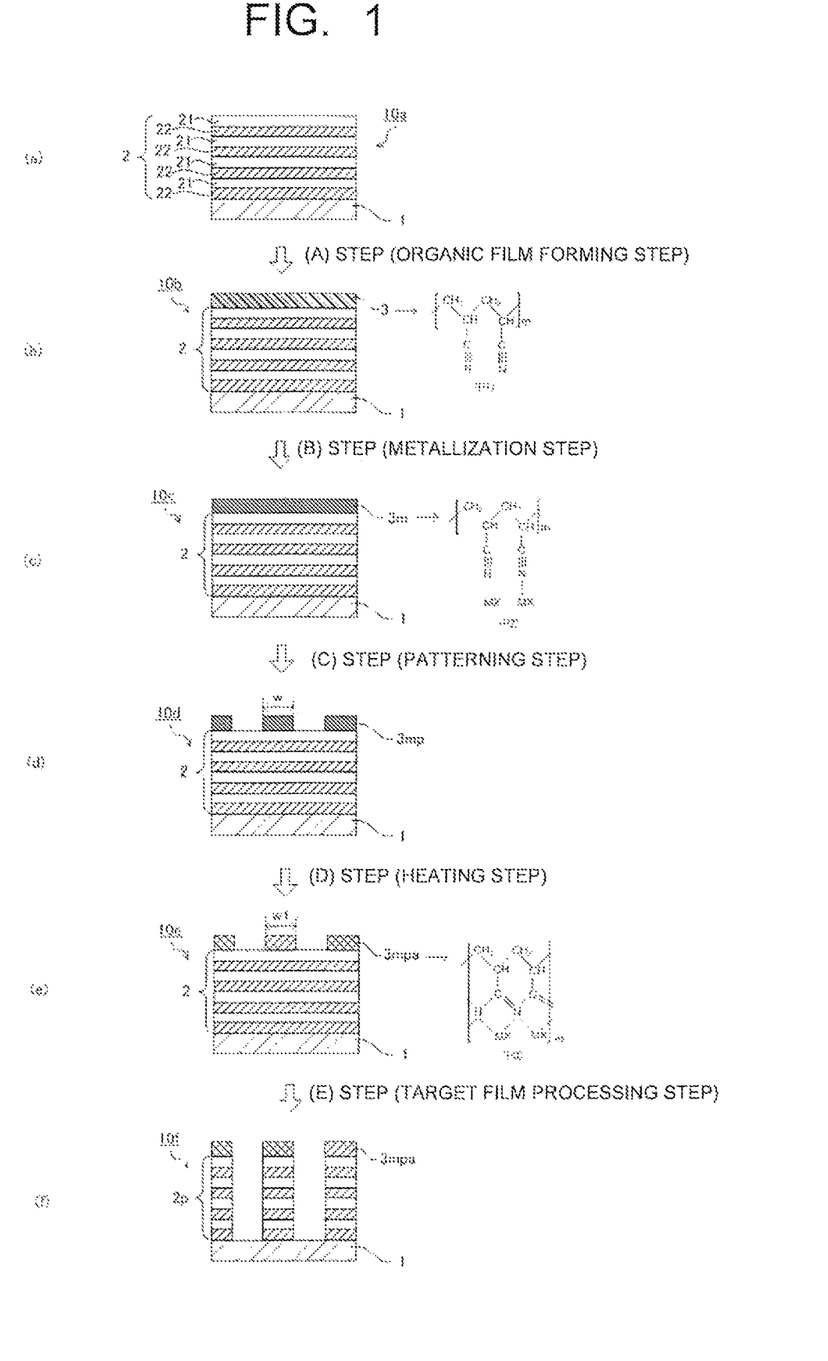
FIG. 1 illustrates one example of a method of manufacturing a semiconductor device according to an embodiment in the order of steps.

FIG. 1 illustrates one example of the method of manufacturing the semiconductor device according to the embodiment in the order of steps. FIG. 1(a) illustrates a cross-sectional view of a stack 10a having a target film 2 on a semiconductor substrate 1 Cross-sectional views of stacks obtained by performing the (A) to (E) steps on the stack 10a are illustrated in FIG. 1(b) to FIG. 1(f), respectively. Hereinafter, with reference to FIG. 1, the (A) step to the (E) step in the method of manufacturing the semiconductor device in the embodiment will be explained.

(A) Step

The (A) step is a step of forming an organic film 3 containing polyacrylonitrile on the target film 2 of the stack 10a in which the target film 2 is stacked on the semiconductor substrate 1, which is illustrated in FIG. 1(a) as a cross-sectional view. In FIG. 1(a), the target film 2 formed on the semiconductor substrate 1 is a stacked film in which a nitride film 21 and an oxide film 22 are stacked alternately. In FIG. 1(a), as the target film 2, the stacked film of the nitride films 21 and the oxide films 22 is illustrated as an example, but the target film 2 is not limited to this. The target film 2 may be a stacked film or the like forming a three-dimensional memory cell array such as a NAND-type flash memory, for example. Further, the target film 2 may be a single layer film such as a silicon oxide film.

In the (A) step, the organic film 3 containing polyacrylonitrile is formed by a polymer containing a block unit of polyacrylonitrile, for example. The organic film 3 contains polyacrylonitrile, which means that the organic film 3 contains a polymer containing a block unit of polyacrylonitrile concretely (to be also referred to as a polymer (A), hereinafter).

(Polymer (A))

The block unit of polyacrylonitrile contained in the polymer (A) is represented by the following chemical formula (1), for example. n represents the number of repetitions of a monomer unit with acrylonitrile set to a component monomer, and n is an integer of two or more.

[Chemical formula 1]

(1)

Here, it has been known that a nitrogen atom of a cyano group contained in the monomer unit (1) has a lone-pair of electrons, and thereby the monomer unit (1) can coordinate with a metal compound. The present inventors have confirmed that the metal compound is coordinated to a block unit of polyacrylonitrile which is then heated where the metal compound is strongly stabilized to complete the present embodiment. Here, the metal compound is coordinated to the block unit of polyacrylonitrile contained in the organic film, which is then heated, and thereby, for example, the metal-containing organic film in the embodiment, namely, a metal-containing organic film containing a structure in which cyano groups of polyacrylonitrile are cyclized, and to nitrogen atoms of the cyclized cyano groups, the metal compound is coordinated, is obtained.

The following formula (F) is a formula expressing a state where a block unit of polyacrylonitrile (P1) is converted to a structure represented by a chemical formula (P2) in which metal compounds MX are coordinated after metallization, and further by heating, the structure is converted to a structure represent by a chemical formula (P3) in which adjacent cyano groups in the block unit of polyacrylonitrile are bonded cyclically while the metal compounds MX being coordinated. Incidentally, the metal-containing organic film having the structure represented by the chemical formula (P3) is one example of a preferred aspect of the metal-containing organic film in the embodiment.

The chemical formulas (P1), (P2), and (P3) are chemical formulas of the two repeated monomer units (1) for convenience and represent an aspect in which the monomer units adjacent to each other in the same main chain form (P3), but can also form the similar aspect with cyano groups in the monomer units (1) in different main chains close to each other.

Incidentally, a block unit of the repeated chemical structural formulas (P2) may contain an acrylonitrile monomer unit in which the metal compound MX is not partially coordinated to the nitrogen atom of the cyano group. Similarly, a block unit of the repeated chemical structural formulas (P3) may contain an acrylonitrile monomer unit in which the metal compound MX is partially coordinated to a nitrogen atom of a not-cyclized cyano group, an acrylonitrile monomer unit in which the metal compound MX is not coordinated to the nitrogen atom of the cyclized cyano group, and further an acrylonitrile monomer unit in which neither the cyclization nor the coordination of the metal compound MX is performed. In the following explanation, the structure represented by the chemical structural formula (P2) or the chemical structural formula (P3) may include the above-described aspects.

In the metal compound MX, M represents a metal and X represents an atom or a group bonded to the metal. MX is preferred to be a metal oxide or a metal hydroxide, and is more preferred to be a metal oxide. In the chemical structural formulas (P1), (P2), and (P3), m/2 represents the number of repetitions of the monomer unit (1) equivalent to n of the monomer unit (1) and m/2 is an integer of two or more. In the chemical formula (P3), . . . represents a coordination bond.

[Chemical formula 2]

Formula (F)

The changes in structure of the polymer (A) represented by the formula (F) are changes to occur in the process of the (A) step to the (E) step of the method of manufacturing the semiconductor device according to the embodiment. The changes in structure of the polymer (A) will be explained below in association with the (A) step to the (E) step. The reference numerals and symbols added to an organic film, a composite film, and so on to be used in the following explanation are the reference numerals and symbols illustrated in FIG. 1, and details are as will be described later.

In the formula (F), the block unit of polyacrylonitrile (Pt) is a structure contained in the organic film 3 formed in the (A) step. Further, the structure represented by (P2) illustrates a structure contained in a composite film 3m after the (B) step (metallization step). The composite film 3m having the structure represented by (P2) can be easily pattern-formed, and thus, in the (C) step, pattern formation is performed on the composite film 3m.

As above, in the method of manufacturing the semiconductor device according to the embodiment, after metallization, the pattern formation is performed in the (C) step, and thus an obtained composite film pattern 3mp is not liable to dimensional change such as expansion caused by metallization. That is, in the method of manufacturing the semiconductor device according to the embodiment, it is possible to form the composite film pattern 3mp having high dimensional accuracy.

Further, in the (D) step the metal-containing organic film in the embodiment obtained by heating the composite film pattern 3mp obtained in the (C) step, concretely, a mask pattern 3mpa made of the composite film containing the structure represented by (P3) has an extremely high etch resistance as compared to a mask pattern obtained by a method in a comparative example to be described below. Examples of etching include reactive ion etching (RIE), ion beam etching (IBE), and the like, and sufficient resistance properties can be achieved for IBE where it particularly requires high etch resistance properties.

Figure 2:
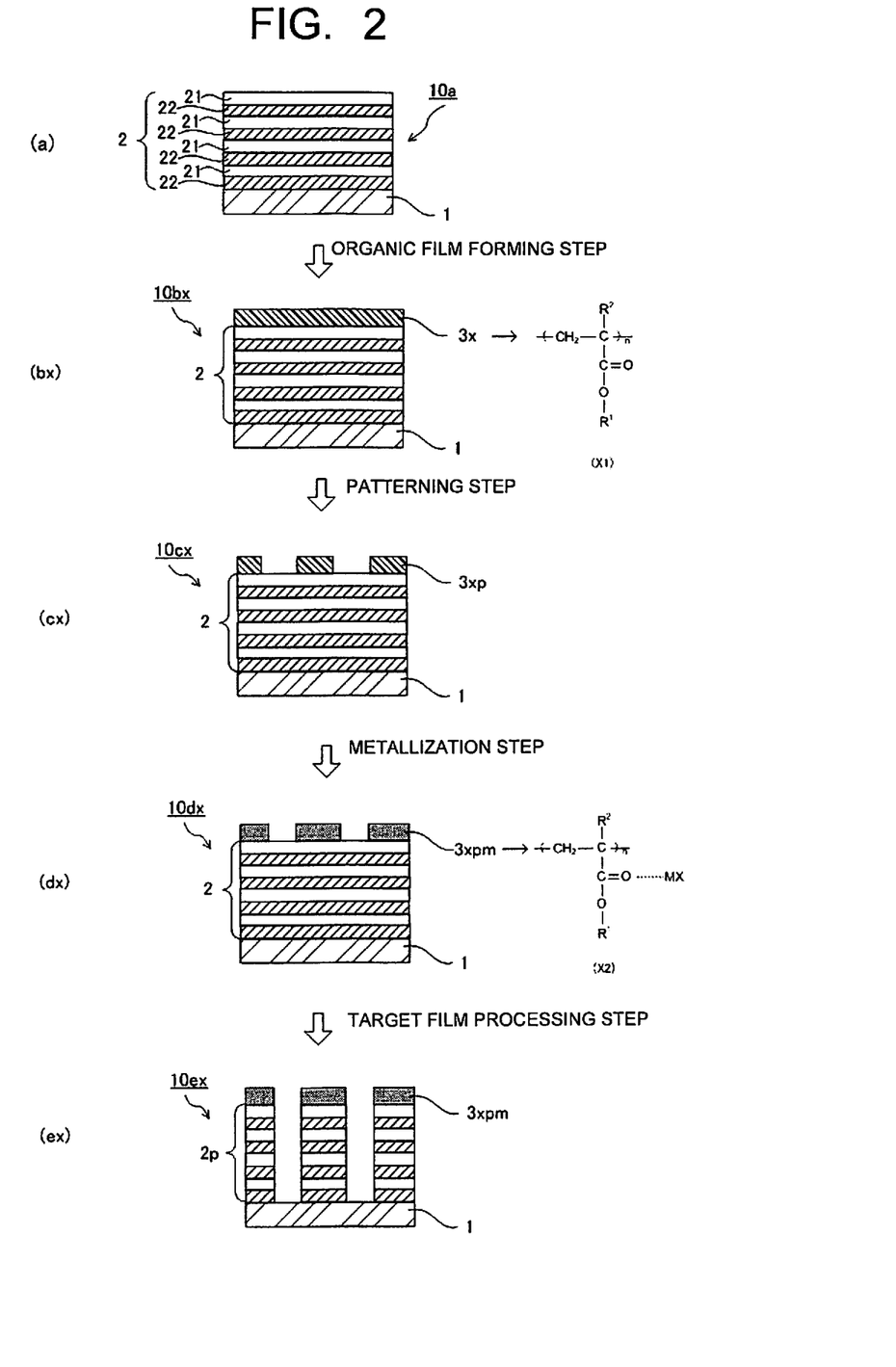
FIG. 2 illustrates a method of manufacturing a semiconductor device using a metal-containing organic film in a comparative example in the order of steps.

FIG. 2 illustrates a method of manufacturing a semiconductor device in the comparative example including a step of forming an organic film 3x on the target film 2 of the semiconductor substrate 1 having the target film 2, a step of forming a pattern on the organic film 3x to make an organic film pattern 3xp, a step of metalliing the obtained organic film pattern 3xp and forming a composite film pattern 3xpm, and a step of processing the target film 2 by using the composite film pattern 3xpm as a mask pattern in the order of steps as FIG. 2(a) to FIG. 2(ex).

Here, in the manufacturing method in the comparative example, organic film materials are selected in order to obtain a composite film having high etch resistance by metallizing the organic film. From such a viewpoint, as the organic film, an organic film formed by using a polymer containing a monomer unit having a carbonyl group at a side chain, for example, is typically used. This is because in the case where the metal compound is coordinated to the lone-pair of electrons in the compound, the metal compound is coordinated to the lone-pair of electrons of an oxygen atom of the carbonyl group.

The manufacturing method in the comparative example illustrated in FIG. 2 will be explained as an example where the manufacture is performed using a polymer containing a monomer unit of (meth)acrylic ester (X1) as the monomer unit having a carbonyl group at a side chain. The following formula (Fx) expresses that the monomer unit (X1) in the organic film is metallized, to thereby obtaining a composite film having a structure represented by a chemical formula (X2) in which the metal compound MX is coordinated. In the formula (Fx), $R^2$ represents a hydrogen atom or a methyl group and $R^1$ represents a hydrocarbon group having 1 to 20 carbon atoms. Here, the (meth)acrylic ester is a generic name of acrylate ester and methacrylate ester. n is the number of repetitions of the monomer unit (X1).

[Chemical formula 3]

Formula (Fx)

A stack 10a which consists of the target films 2, is stacked on the semiconductor substrate 1, which is illustrated in FIG. 2(a) as a cross-sectional view, is the same in configuration as the stack 10a illustrated in FIG. 1(a). In the manufacturing method in the comparative example illustrated in FIG. 2, the organic film 3x containing the monomer unit (X1) is formed on the target film 2 of the stack 10a to form a stack 10bx (illustrated in FIG. 2(bx) as a cross-sectional view), and then patterning of the organic film 3x containing the polymer containing the monomer unit (X1) is performed to obtain a stack 10cx having the organic film pattern 3xp illustrated in FIG. 2(cx) as a cross-sectional view.

Further, the organic film pattern 3xp is metallized, to thereby obtain a stack 10dx having the composite film pattern 3xpm illustrated in FIG. 2(dx) as a cross-sectional view. In the manufacturing method in the comparative example, the composite film has high etch resistance, and thus patterning is difficult. Accordingly, the composite film pattern 3xpm is formed in the order of the formation of the organic film 3x, the patterning of the organic film 3x, and the metallization of the organic film pattern 3xp, as stated above. Then, by using the composite film pattern 3xpm as a mask pattern, the target film 2 is processed to obtain a patterned target film 2p (in FIG. 2(ex), a cross-sectional view is illustrated as a stack 10ex made of the semiconductor substrate 1, the patterned target film 2p, and the composite film pattern 3xpm).

According to the manufacturing method in the embodiment, as a component polymer of the organic film, the polymer (A) containing the block unit of polyacrylonitrile (P1) is set, thereby making it possible to perform patterning after metallization, so that the composite film pattern is not easily affected by the dimensional change caused by metallization or the like as compared to the case where patterning is performed before metallization. Accordingly, the mask pattern can be obtained with higher accuracy in dimensions and the obtained mask pattern has a characteristic of being excellent in etch resistance by containing the structure represented by (P3).

The polymer (A) is not limited in particular as long as it is a polymer containing the block unit of polyacrylonitrile (P1). The number of repetitions m/2 of the monomer unit (1) in the block unit of polyacrylonitrile (P1) is, as described above, two or more in order to obtain the structure of (P3)

after metallization and heating, is preferably 10 or more, and more preferably 100 or more.

The polymer (A) may be composed only of the block unit of polyacrylonitrile (P1), and may further contain a monomer unit with a compound other than acrylonitrile set to a component monomer (to be referred to as an "alternative monomer unit" hereinafter) as necessary. The polymer (A) having an alternative monomer unit, thereby making it possible to adjust; solubility of the polymer (A) to a solvent, film formability, a glass transition point of an obtained film, and the like. Incidentally, the solubility of the polymer (A) to a solvent is a property to be required when the organic film is formed by a later-described wet-coating method.

Examples of the monomer composing the alternative monomer unit include a monomer having an ethylene group (>C=C<) and a group which enables the above-described functions when being introduced into the polymer (A). In the case where solubility to an organic solvent is imparted to the polymer (A), for example, as the alternative monomer unit, a monomer unit with (meth)acrylic ester set to a component monomer, concretely, the monomer unit (X1) is preferred. Concrete examples of the monomer composing the alternative monomer unit include styrene, hydroxystyrene, methyl (meth)acrylate, ethyl(meth)acrylate, hydroxylethyl(meth)acrylate, and the like. When the polymer (A) contains the alternative monomer unit, the monomer unit can be a single type, or, two or more types of different monomers may be contained.

The ratio of the monomer unit (1) in the polymer (A) is preferably 90 to 100 mol % and more preferably 95 to 100 mol % to all the monomer units in the polymer (A). Two or more of the monomer units (1) are present in the polymer (A) in blocks unit even if the alternative monomer unit is contained.

The polymer (A) has the block unit of polyacrylonitrile (P1), thereby enabling both an excellent metallization property in an organic film and high etch resistance. From the viewpoints of the metallization property and the etch resistance as stated above, the ratio of the monomer unit (1) in the polymer (A) is preferably 100 mol %.

The production of the polymer (A) is performed by an ordinary method, which is, for example, bulk polymerization, solution polymerization, emulsion polymerization, suspension polymerization, or the like, by using acrylonitrile as a monomer in the case of the ratio of the monomer unit (1) being 100 mol %. The solution polymerization is preferred from the viewpoints that the polymer is redissolved to a solvent after polymerization, as well as exclusion of impurities such as an emulsifier and water. When the polymer (A) is synthesized by the solution polymerization, normally, a predetermined amount of a monomer is dissolved in a polymerization solvent and polymerized under the presence of an initiator.

In the case where the polymer (A) contains the block unit of polyacrylonitrile (P1) and the alternative monomer unit, component monomers of acrylonitrile and the alternative monomer unit are used at predetermined ratios and polymerized by the method similar to the above. Polymerization conditions such as an amount of the solvent, temperature, and a polymerization time are appropriately selected according to the kind of the monomer, the molecular weight of the polymer (A) to be synthesized, and so on.

A weight average molecular weight (Mw) of the polymer (A) is preferably 1,000 to 1,000,000 and more preferably 1,000 to 100,000. The Mw of the polymer (A) can be measured by a gel permeation chromatography (GPC).

A method of forming the organic film on the target film by using the polymer (A) may be a dry-coating method or a wet-coating method. When the organic film is formed by the dry-coating method, the organic film can be formed by the dry-coating method, for example, by a vapor deposition method using an organic film forming material containing the polymer (A) itself. When the organic film is formed by the wet-coating method, a method is preferred in which a coating solution containing the organic film forming material containing the polymer (A) and a solvent is applied on the target film and is dried to form the organic film.

In the case of forming the organic film on the target film by using the polymer (A), normally, the wet-coating method using a coating solution resulting from a solution of the polymer (A) in a solvent to dissolve the polymer (A) is applied. Here, the organic film may be composed only of the polymer (A), or may contain other components other than the polymer (A) within a range not impairing the effect of the embodiment. When the organic film contains other components, the content of other components is preferably 50 weight % or less and more preferably 10 weight % or less to the entire organic film. The organic film is most preferably composed solely of the polymer (A).

Examples of the solvent dissolving the polymer (A) include aromatic hydrocarbons such as toluene, xylene, and mesitylene, ketones such as cyclohexanone, acetone, ethylmethylketone, and methylisobutylketone, lactones such as γ-butyrolactone and δ-valerolactone, and cellosolves such as methylcellosolve, methylcellosolveacetate, ethylcellosolveacetate, butylcellosolveacetate, and propylene glycol monomethyl ether acetate (PGMEA), and γ-butyrolactone is preferred. Two or more kinds of the solvents can be used in combination if necessary.

The content of the polymer (A) in the coating solution is preferably 1 to 20 weight % and more preferably 1 to 10 weight % relative to the entire coating solution. The content of the solvent in the coating solution is preferably 80 to 99 weight % and further preferably 90 to 99 weight % relative to the entire coating solution. The contents of the polymer (A) and the solvent in the coating solution are in the above-described ranges, and thereby the formation of the organic film on the target film by the wet-coating method is performed successfully.

In the wet-coating method, first, as a method of applying the coating solution in which the coating solution is applied on the target film to form an applied film, ordinary methods are applicable. Concretely, spin coating and dip coating are preferred.

Thereafter, the remaining solvent is removed from the applied film by drying, and thereby the organic film 3 can be formed. FIG. 1(b) is a cross-sectional view illustrating the stack 10b with the organic film 3 formed on the target film 2 of the stack 10a by the (A) step. In the organic film 3, the block unit of polyacrylonitrile (Pt) is contained.

(B) Step

The (B) step is a step of applying the metal compound to the organic film 3 obtained in the (A) step and forming the composite film 3m being the organic film 3 into which the metal compound MX is infiltrated.

As a method of infiltrating the metal compound MX into the organic film 3, a method in which a precursor is infiltrated into an organic film, and then oxidation process or the like converts the precursor into the metal compound MX that is present in a composite film eventually is preferred. Hereinafter, metallization will be explained while using the method of using a precursor as an example, but in the embodiment, the method of infiltrating the metal compound MX into the organic film 3 is not limited to this as long as it is a method enabling infiltration of a metal compound.

A stack which is in order of the organic film 3 on target film 2 which are on the semiconductor substrate 1 is carried into a vacuum device to expose the organic film 3 to gas or liquid of a precursor. On this occasion, a heating treatment is preferable at a temperature of 50° C. or more and at a temperature below 200° C. Having the treatment temperature to 50° C. or more, thereby making it possible to impregnate the polymer (A) of the organic film 3 with molecules of the precursor more securely. The treatment temperature is set below 200° C., thereby making it possible to adsorb the molecules of the precursor to the lone-pair of electrons of the nitrogen atom of the cyano group present at a side chain of the polymer (A) contained in the organic film 3.

As for precursor, precursors that are used for a chemical vapor deposition (CVD) method and an atomic layer deposition (ALD) method can be used without any limitation in particular.

The precursor is a metal compound that has the same metal M as the metal compound MX has, but different in an X part therefrom. Examples of the metal M contained in the precursor include aluminum, titanium, tungsten, vanadium, hafnium, zirconium, tantalum, molybdenum, and so on. Among these organometallic compounds and halides, metals having a sufficiently small ligand are usable as the precursor.

Concretely, the usable precursor can contain at least any one of $AlCl_3$, $TiCl_4$, $WCl_6$, $VCl_4$, $HfCl_4$, $ZrCl_4$, trimethylaluminum (TMA), and so on. In the embodiment, TMA is preferred.

After the precursor is adsorbed into the organic film 3, this is then exposed in a water vapor atmosphere, and thereby, the precursor in the organic film 3 is subjected to the oxidation treatment. Thereby, the metal M contained in the molecules of the precursor precipitates in the polymer (A) as the metal compound MX. For example, in the case of the precursor being TMA, the metal precipitates in the polymer (A) as aluminum oxide or the like. The oxidation treatment of the precursor is normally performed by using an oxidant such as water, ozone, or oxygen plasma. Incidentally, the spontaneous oxidation treatment of the precursor may be performed by moisture in the atmosphere without particular treatment. The organic film 3 is thereby metallized to form the composite film 3m resulting from introduction of the metal compound MX into the organic film 3.

FIG. 1(c) is a cross-sectional view illustrating a stack 10c with the composite film 3m resulting from metallization of the organic film 3 in the stack 10b illustrated in FIG. 1(b) by the (B) step. The organic film 3m includes the structure represented by the chemical formula (P2) in which the block unit of polyacrylonitrile (P1) is metallized to coordinate the metal compounds MX, which is similar to that represented by the formula (F).

(C) Step

The (C) step is a step of partially removing the composite film 3m on the target film 2 obtained in the (B) step and forming the composite film pattern 3mp applying the left portion as a pattern. The formation of the composite film pattern 3mp, namely patterning of the composite film 3m is performed by an ordinary method. Concretely, it can be performed by etching or the like.

FIG. 1(d) illustrates a cross-sectional view of a stack 10d with the composite film pattern 3mp obtained by patterning the composite film 3m of the stack 10c illustrated in FIG. 1(c).

(D) Step

The (D) step is a step of heating the composite film pattern 3mp on the target film 2 obtained in the (C) step and forming the mask pattern 3mpa being the heated composite film pattern. FIG. 1(e) illustrates a cross-sectional view of a stack 10e with the mask pattern 3mpa obtained by heating the composite film pattern 3mp contained in the stack 10d illustrated in FIG. 1(d). The mask pattern 3mpa contains the structure represented by (P3) obtained from the structure represented by (P2) through heating and changing in structure, which is similar to that represented by the formula (F). The structure represented by (P3) is a structure in which the adjacent cyano groups in the structure represented by (P2) are bonded cyclically with the metal compounds MX being coordinated.

The heating in the (D) step is performed under the condition that the structure represented by (P2) changes to the structure represented by (P3). Concretely, a heating temperature is preferably 200° C. or more and less than 1000° C., and more preferably 200° C. or more and less than 600° C. The heating temperature is set to 200° C. or more, and thereby the change from the structure represented by (P2) to the structure represented by (P3) is performed sufficiently. The heating temperature is set to less than 1000° C., to thereby avoid thermal degradation of a polyacrylonitrile structure.

A heating time is preferably about for 1 to 1,500 minutes, more preferably for 10 to 1,500 minutes, and further preferably for 30 to 1,500 minutes depending on the thickness or size of the composite film pattern 3mp.

Here, in the manufacturing method in the embodiment, the dimensional change could sometimes be observed since the pattern slightly contracts during the heating step. That is, in the mask pattern 3mpa obtained by heating the composite film pattern 3mp, a slight decrease in dimensions is sometimes observed from the composite film pattern 3mp.

When a width of a predetermined place of the composite film pattern 3mp after the above-described (C) step is set to w (illustrated in FIG. 1(d)) and a width of the same place of the mask pattern 3mpa obtained after the (D) step is set to w1 (illustrated in FIG. 1(e)), for example, a rate of change between the both is expressed by $(w-w1)/w \times 100(\%)$. This rate of change will be referred to as a rate of decrease in a width-direction dimension caused by heating (Y) below. The rate of decrease in a width-direction dimension caused by heating (Y) is preferably 20% or less, more preferably 10% or less, and particularly preferably 0%. Accordingly, the heating condition in the (D) step is preferably selected so that the rate of decrease in a width-direction dimension caused by heating (Y) becomes equal to or less than the above-described range.

A heating method is not limited in particular as long as it is preferably a method of heating at least the composite film pattern 3mp to the above-described temperature. Concretely, a method is preferred in which the entire stack 10d having the composite film pattern 3mp on the target film 2 on the semiconductor substrate 1 is allowed to stand in a thermostatic oven or on a hot plate controlled to a predetermined temperature for a predetermined period of time.

Incidentally, an infrared spectroscopic analysis makes it possible to confirm that the mask pattern 3mp has the structure (P3) by analogy. The mask pattern 3mpa having the structure (P3), which is obtained in this manner, is high in accuracy in dimensions of a pattern as well as superior in etch resistance compared to the mask pattern to be obtained by metallizing the above-described organic film, which is used in the comparative example. Furthermore, a method of using a carbon deposited layer using a CVD method as a mask pattern is known. The mask pattern 3mpa has advantages that the material is low in price and facile in film formation while replacement of the carbon deposited layer using a CVD method that is extremely high in film formation cost with the mask pattern 3mpa is possible.

(E) Step

The (E) step is a step of processing the target film 2 by etching such as reactive ion etching (RIE) or ion beam etching (IBE) while using the mask pattern 3mpa as a mask and to form the patterned target film 2p. Thereby, the target film 2p is patterned having a high aspect ratio shape is formed. FIG. 1(f) is a view illustrating a cross section of a stack 10f with the patterned target film 2p obtained by processing the target film 2 of the stack 10e illustrated in FIG. 1(e) by etching.

Thereafter, for example, a memory cell array is formed by using a known method. For example, it is assumed that a hole pattern is formed on the stacked film through the above-stated processes. A memory structure can be formed by embedding a block layer, a charge storage layer, a tunnel layer, a channel layer, and a core layer in such a hole. Thereafter, only the nitride films of the stacked film are removed through a slit that is formed separately from the hole pattern having the memory structure, and a conductive film is embedded instead. Thereby, the stacked film where an insulating film (the oxide film) and the conductive film are alternately stacked is formed. It is possible to make the conductive films in the stacked film that function as a word line.

According to the method of manufacturing the semiconductor device in the embodiment, the organic film is formed using the polymer containing the block unit of polyacrylonitrile (P1), so that the mask pattern obtained by using the organic film is high in accuracy in dimensions and has high etch resistance, particularly high IBE resistance. This makes it possible to impart a processed shape with a high aspect ratio to the target film with high accuracy in dimensions.

In the method of manufacturing the semiconductor device in the embodiment, in order to increase the accuracy in dimensions of the mask pattern, more specifically, in order to lower the rate of decrease in a width-direction dimension caused by heating (Y), the above-described (D) step may be configured to include the following three steps.

(D1) A step of embedding a core material in the portion from which the composite film is partially removed in the (C) step (to be also referred to as a (D1) step or a core material embedding step hereinafter)

(D2) A step of heating a pattern of the composite film in which the core material is embedded obtained in (D1) (to be also referred to as a (D2) step or a heating step of (D2), hereinafter)

(D3) A step of removing the core materials after the (D2) step (to be also referred to as a (D3) step or a core material removing step, hereinafter)

Figure 3:
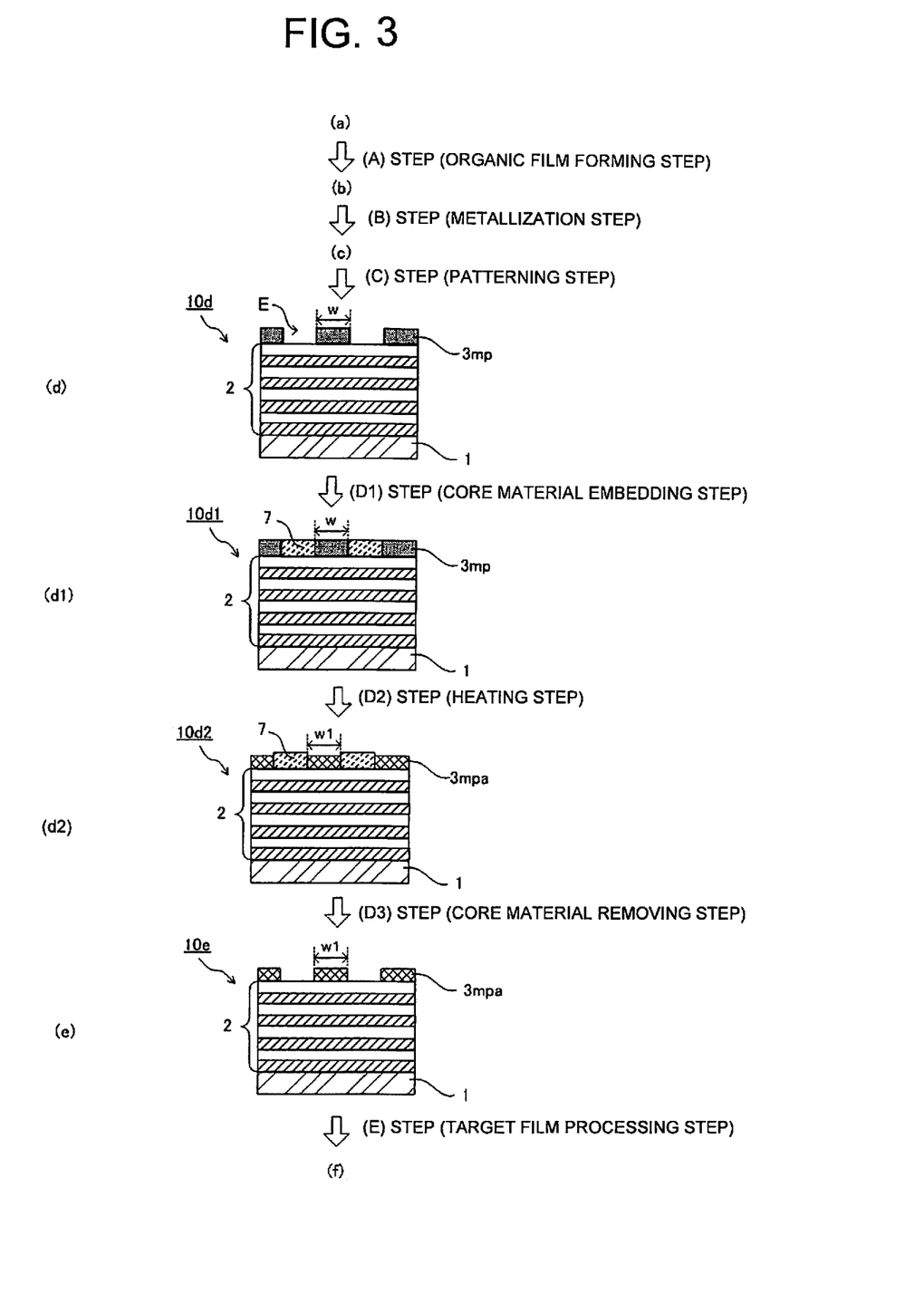
FIG. 3 illustrates another example of the method of manufacturing the semiconductor device according to the embodiment in the order of steps.

FIG. 3 illustrates an example where the heating step is performed by the three steps of (D1) step to (D3) step in the order of steps in one example of the method of manufacturing the semiconductor device according to the embodiment illustrated in FIGS. 1. (a), (b), (c), and (f) in FIG. 3 are that the cross-sectional views of (a), (b), (c), and (f) in FIG. 1 are omitted and only the symbols are added.

FIG. 3(d) illustrates a cross-sectional view of a stack 10d having the same configuration as that of the stack 10d illustrated in FIG. 1(d). The stack 10d has a configuration in which the composite film pattern 3mp is provided on the target film 2 on the semiconductor substrate 1 and is obtained by subjecting the stack 10a (not illustrated in FIG. 3) to the (A) step to the (C) step.

In the manufacturing method illustrated in FIG. 3(d) to FIG. 3(e), the (D1) step is a step of embedding a core material 7 in a portion E (to be referred to as an opening portion E, hereinafter) from which the composite film 3m is removed in the (C) step, which is present between the composite film patterns 3mp of the stack 10d. FIG. 3(d1) illustrates a cross-sectional view of a stack 10d1 obtained by embedding the core material 7 in the opening portion E of the stack 10d.

As the material of the core material 7 used in the (D1) step, materials that are capable of being sufficiently filled in the opening portion E, materials that show little change in shape under the heating condition of (D2), and materials that are removed easily in the (D3) step are preferred. Concrete examples of the core material 7 include poly(meth)acrylic acid alkyl ester such as polymethyl methacrylate, polyethyl methacrylate, or poly t-butyl methacrylate and a polymer containing an aromatic structure such as polystyrene or polyvinylnaphthalene, in addition to polyethylene glycol, polypropylene glycol, and so on.

The embedding of the core material 7 in the opening portion E is performed by spin coating, for example.

The heating step of (D2) can be performed in the same device under the same conditions and so on as those of the method in the above-described (D) step. In the (D2) step, the presence of the core material 7 suppresses the decrease in dimension in a horizontal direction and the dimension decreases in a thickness direction in the composite film pattern 3mp. Thereby, the rate of decrease in a width-direction dimension caused by heating (Y), which is expressed by $(w-w1)/w \times 100(\%)$, can be suppressed to about 0%. Incidentally, w represents the width of a predetermined place of the composite film pattern 3mp and w1 represents the width, of the mask pattern 3mpa, of the same place as that of the composite film pattern 3mp.

Incidentally, the effect of the decrease in dimension in the thickness direction of the composite film pattern 3mp on the process of the target film 2 in the (E) step is relatively small. FIG. 3(d2) is a view illustrating a cross section of a stack 10d2 with the mask pattern 3mpa having the structure (P3) obtained by heating the composite film pattern 3mp of the stack 10d1.

After the (D2) step, by the (D3) step, the core material 7 is removed to obtain a stack 10e illustrated in FIG. 3(e). The removal of the core material 7 is performed by etching or rinsing by a dissolving solvent, for example. The stack 10e has the same configuration as that of the stack 10e illustrated in FIG. 1(e). Thereafter, the target film 2 is processed in the same manner as the above.

Figure 4:
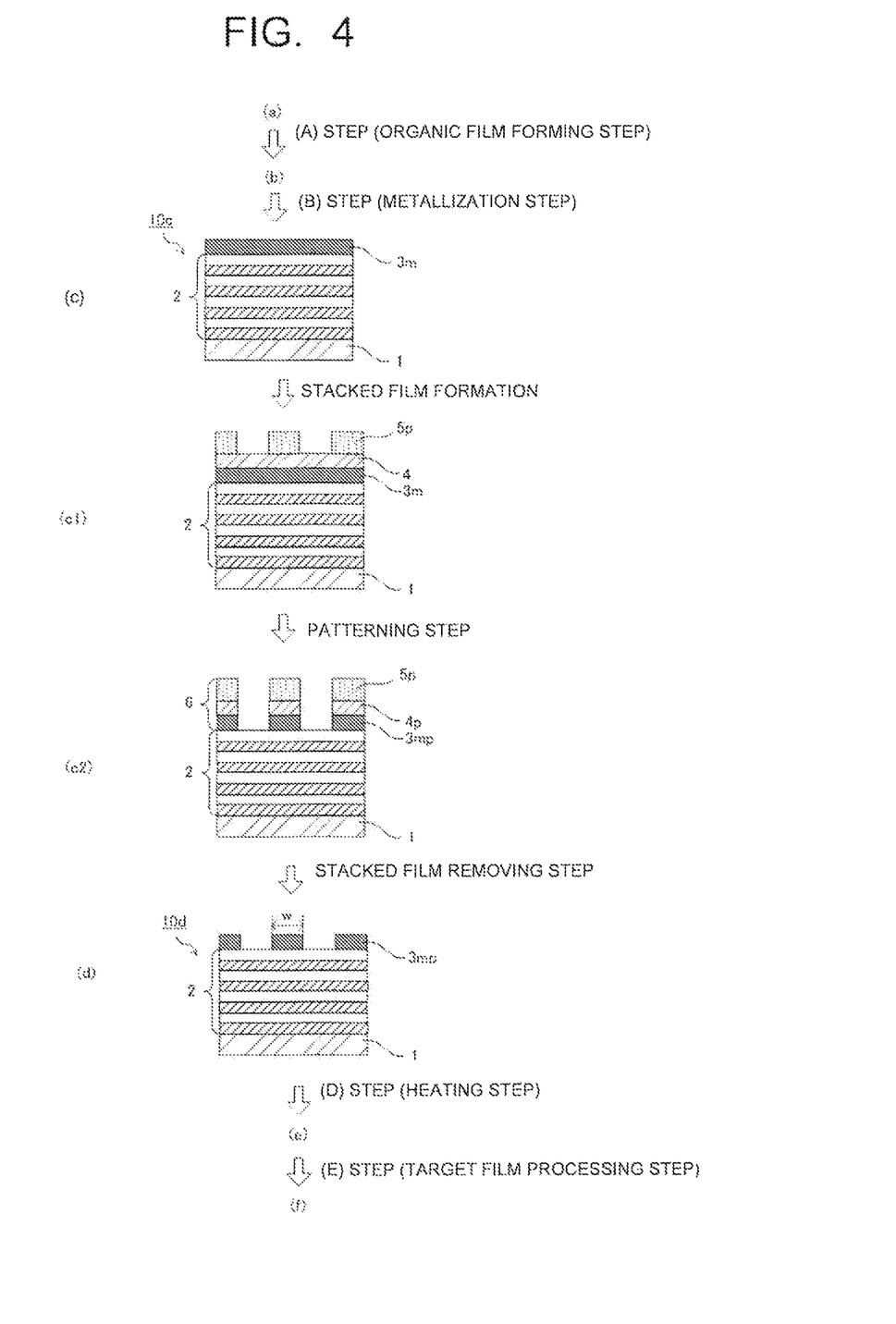
FIG. 4 illustrates another example of the method of manufacturing the semiconductor device according to the embodiment in the order of steps.

In the method of manufacturing the semiconductor device, a stacked mask structure is sometimes employed in the mask pattern in order to achieve a processed shape having a high aspect ratio in the target film. FIG. 4 illustrates one example of the case where the method of manufacturing the semiconductor device in the embodiment is applied to the stacked mask structure in the order of steps. When the method of manufacturing the semiconductor device in the embodiment is applied to the stacked mask structure, the composite film obtained by metallizing the organic film obtained from the polymer containing the block unit of polyacrylonitrile is preferably used for a base film to be formed between a resist film and the target film.

In a method of manufacturing a semiconductor device including steps illustrated in FIG. 4, an organic film forming step and a metallization step can be made the same as those in the method of manufacturing the semiconductor device including the steps illustrated in FIG. 1. (a), (b), (e), and (f) in FIG. 4 are that the cross-sectional views of (a), (b), (e), and (f) in FIG. 1 are omitted and only the symbols are added. The method of manufacturing the semiconductor device including the steps illustrated in FIG. 4 includes a step of forming a stacked film on the composite film 3m before the patterning step of the composite film 3m.

FIG. 4(c) illustrates a cross-sectional view of the stack 10c having the composite film 3m on the target film 2 on the semiconductor substrate 1, and FIG. 4(c1) and FIG. 4(c2) each are a cross-sectional view schematically illustrating the step of patterning the composite film 3m of the stack 10c. As illustrated in FIG. 4(1c) and FIG. 4(c2), the composite film 3m functions as a base film of a stacked mask structure 6. FIG. 4(c1) illustrates a state where as a functional film to be subjected to patterning, a silicon oxide film 4 is formed on the composite film 3m and thereon, a resist pattern 5p is formed.

The silicon oxide film 4 is formed by heating a SOG (Spin On Glass) film formed on the composite film 3m by the following method, for example, at a predetermined temperature of, for example, 150 to 300° C. The SOG film is formed by spin-coating the composite film 3m with a wet-coating solution resulting from dissolution of components of the SOG film in an organic solvent.

At this time, although not-illustrated, antireflection film may be formed on the silicon oxide film 4. The antireflection film prevents reflection from a bottom-surface when a resist film formed through the following process is patterned and enables precision exposure.

Then, the resist film is formed on the silicon oxide film 4, and the resist film is made into the resist pattern 5p by a lithography technology, an imprinting technology, or the like. In the imprinting technology, resist is dropped on the silicon oxide film 4, a template where a fine pattern is formed is pressed onto the resist film and is irradiated with ultraviolet rays to cure the resist film, and thereby, the resist pattern 5p is formed.

FIG. 4(c2) is a cross-sectional view illustrating a state obtained after the silicon oxide film 4 is etched while the resist pattern 5p is a mask to form a silicon oxide film pattern 4p, and further the composite film 3m is etched applying the resist pattern 5p and the silicon oxide film pattern 4p as a mask to form the composite film pattern 3mp. The etching of the silicon oxide film 4 is performed by using a fluorine-based gas, and the etching of the composite film pattern 3mp is performed by using an oxygen-based gas. As illustrated in FIG. 4(c2), a structure in which the composite film pattern 3mp, the silicon oxide film pattern 4p, and the resist pattern 5p are stacked in this order is one example of the stacked mask structure 6.

Incidentally, in the case where an antireflection film is formed on the silicon oxide film 4, the antireflection film is patterned prior to the etching of the silicon oxide film 4. A film thickness of the resist pattern 5p may be adjusted so that the resist pattern 5p disappears after the silicon oxide film pattern 4p is formed. Further, a film thickness of the silicon oxide film pattern 4p may be adjusted so that the silicon oxide film pattern 4p disappears after the composite film pattern 3mp is formed.

In the case where the composite film pattern 3mp is formed by the stacked mask structure 6 as illustrated in FIG. 4, the silicon oxide film pattern 4p and the resist pattern 5p being upper layers of the composite film pattern 3mp are removed before the (D) step, to thereby obtain the stack 10d composed of the semiconductor substrate 1, the target film 2, and the composite film pattern 3mp, which is illustrated in FIG. 4(d) as a cross-sectional view.

Incidentally, in the method of manufacturing the semiconductor device including the steps illustrated in FIG. 4, a heating step and a target film processing step can be made the same as those of the method of manufacturing the semiconductor device including the steps illustrated in FIG. 1 or FIG. 3.

Incidentally, in the above-described stacked mask structure, examples of an upper layer film or a precursor film of it on the base film include a SOC (Spin On Carbon) film, a TEOS (tetraethyl orthosilicate) film, a resist film, and so on in addition to the above-described SOG film. Further, various configurations can be employed for the stacked mask structure by inserting various films in addition to the above or deleting some of the above-described films.

According to the method of manufacturing the semiconductor device in the embodiment, a mask pattern having high etch resistance can be obtained with high accuracy in dimensions by a simple method.

Further, the method of manufacturing the semiconductor device in the embodiment can be applied to the following method of forming a pattern film. The method of forming the pattern film in the embodiment includes the following (Aa) to (Da) steps.

(Aa) A step of forming an organic film using a polymer containing a block unit of polyacrylonitrile (equivalent to the above-described (A) step)

(Ba) A step of applying a metal compound to the organic film obtained in the (Aa) step and forming a composite film (equivalent to the above-described (B) step)

(Ca) A step of partially removing the composite film obtained in the (Ba) step and forming a pattern (equivalent to the above-described (C) step)

(Da) A step of heating the pattern-formed composite film (equivalent to the above-described (D) step)

As described above, the steps included in the method of forming the pattern film in the embodiment are equivalent to the steps included in the method of manufacturing the semiconductor device in the embodiment respectively, so that the concrete methods in the respective steps are applicable similarly.

However, in the method of forming the pattern film in the embodiment, the semiconductor substrate 1 may have the target film 2, which is not essential. Further, in the method of forming the pattern film, a substrate of glass, quartz, mica, or the like can be used in place of the semiconductor substrate 1.

The embodiment further includes a metal-containing organic film including a structure in which a cyano group of polyacrylonitrile is cyclized and a metal compound is coordinated to a nitrogen atom of the cyclized cyano group. In the above-described structure of the metal-containing organic film in the embodiment, a configuration in which a metal compound is coordinated to two nitrogen atoms of the above-described cyano groups to form a chelate ring is preferred.

As a preferred aspect of the metal-containing organic film in the embodiment, there can be cited a metal-containing organic film containing the structure represented by the following chemical formula (P3) described in the method of manufacturing the semiconductor device in the embodiment.

[Chemical formula 4]

(P3)

In the chemical formula (P3), MX represents the metal compound and m/2 represents an integer of two or more . . . represents a coordination bond. MX is preferred to be a metal oxide or a metal hydroxide and is more preferably a metal oxide.

Incidentally, the structure (P3) can be identified as the structure (P3) by confirming whether or not a peak is present near 1610 cm$^{-1}$ and 1380 cm$^{-1}$ through infrared spectroscopy, for example, to have the peak at the both. This is based on the fact that in the case where polyacrylonitrile to which the metal compound is not coordinated is heated to high temperature to form only a ring structure of (—CH—CH$_2$—CH—C=N=C—), a peak derived from a C=N group and a peak derived from a C=C group are observed near 1590 cm$^{-1}$ and 1370 cm$^{-1}$ respectively. Further, this is based on the fact that when polyacrylonitrile to which the metal compound is coordinated is heated to high temperature a ring structure of —N—C=N—MX— in which the metal compound is coordinated to a nitrogen atom of a cyano group is formed, the above-described peak derived from a C=N group and the above-described peak derived from a C=C group are shifted, and the peak is seen near 1610 cm$^{-1}$ and 1380 cm$^{-1}$ respectively.

The metal-containing organic film in the embodiment and the metal-containing organic film containing the structure (P3) can be formed by the methods explained in the method of manufacturing the semiconductor device in the embodiment.

EXAMPLES

Hereinafter, examples are explained.

Example 1

As the polymer (A), there was used a polymer (A1) that contains the block unit of polyacrylonitrile (P1), a monomer unit derived from acrylonitrile at a content ratio of 94 weight %, and a monomer unit derived from methyl acrylate at a content ratio of 6 weight %.

A pattern forming composition was prepared by adding, as a solvent, γ-butyrolactone to the polymer (A1) to have 5 weight % as the content of the polymer (A1), and the pattern forming composition was used to form a mask pattern on a Si substrate by the following method.

(Organic Film Formation)

Si substrates that had been UV irradiated for three minutes were set to spin coat. A rotation of the spin coat was adjusted to 2000 to 3500 rpm, and after the spin coat, the remaining solvent was dried, to obtain an organic film having a thickness of about 300 nm. The obtained Si substrate with organic film was cut into 15 mm-square coupons and they were set to sample substrates for a metallization process.

(Metallization)

The metallization was performed by an atomic layer deposition (ALD) film-forming apparatus. Concretely, the metallization was performed at an exposure mode where the sample substrate for a metallization process was placed in the ALD apparatus, followed by introduction of TMA in a gas phase into the apparatus up to a pressure of 900 Pa under 100° C. A valve was closed to keep the pressure in the above-described state for 600 seconds. The number of cycles was set to one time. After the TMA exposure, the gaseous TMA in the apparatus was replaced with water vapor (H$_2$O), and then a Si substrate with a composite film resulting from metallization of the organic film was taken out from the apparatus.

Here, the ALD apparatus is used for the above-described metallization process, but the above-described operation aims to the infiltration of TMA in the polymer, and does not aim to deposit atomic layers on the substrate, what is called atomic layer deposition (ALD). Therefore, an exposure time period of the metal compound is longer and the number of cycles is smaller as compared to those of normal ALD process.

(Patterning)

A SOG film was formed on the composite film of the composite-film-attached Si substrate, and thereon, a photo-resist was spin coated to be subjected to pattern exposure, development and etching to form a pattern, and thereby a composite-film-pattern-attached Si substrate was obtained.

(Heating)

The composite-film-pattern-attached Si substrate was held on a hot plate for eight hours under the condition of 300° C. in air, to thereby turn a composite film pattern into a mask pattern by heating.

[Evaluation]

(Structure)

The obtained mask pattern was analyzed by infrared spectroscopy, peaks were observed near 1610 cm$^{-1}$ and 1380 cm$^{-1}$ to have the confirm the structure (P3).

(Dimensional Stability)

A pattern width of a predetermined place of the composite-film-pattern-attached Si substrate and a pattern width of a predetermined place of a mask-pattern-attached Si substrate were measured. The width of the composite film pattern of the composite-film-pattern-attached Si substrate was set to w, and the width of the mask pattern of the mask-pattern-attached Si substrate was set to w1. The rate of decrease in a width-direction dimension by heating (Y) was expressed by (w−w1)/w×100(%). The result was 0%.

(Etch Resistance)

The sample substrate for a metallization process was metallized as described above and then heated without being patterned, to thereby obtain a heat-treated-composite-film-attached Si substrate. The heat-treated-composite-film-attached Si substrate was subjected to RIE using a CF$_4$ gas. A film thickness of a heat-treated composite film was measured by an atomic force microscope (AFM). An etching time and an etched thickness (a film thickness decrease amount) are illustrated in FIG. 5 by "■."

Figure 5:
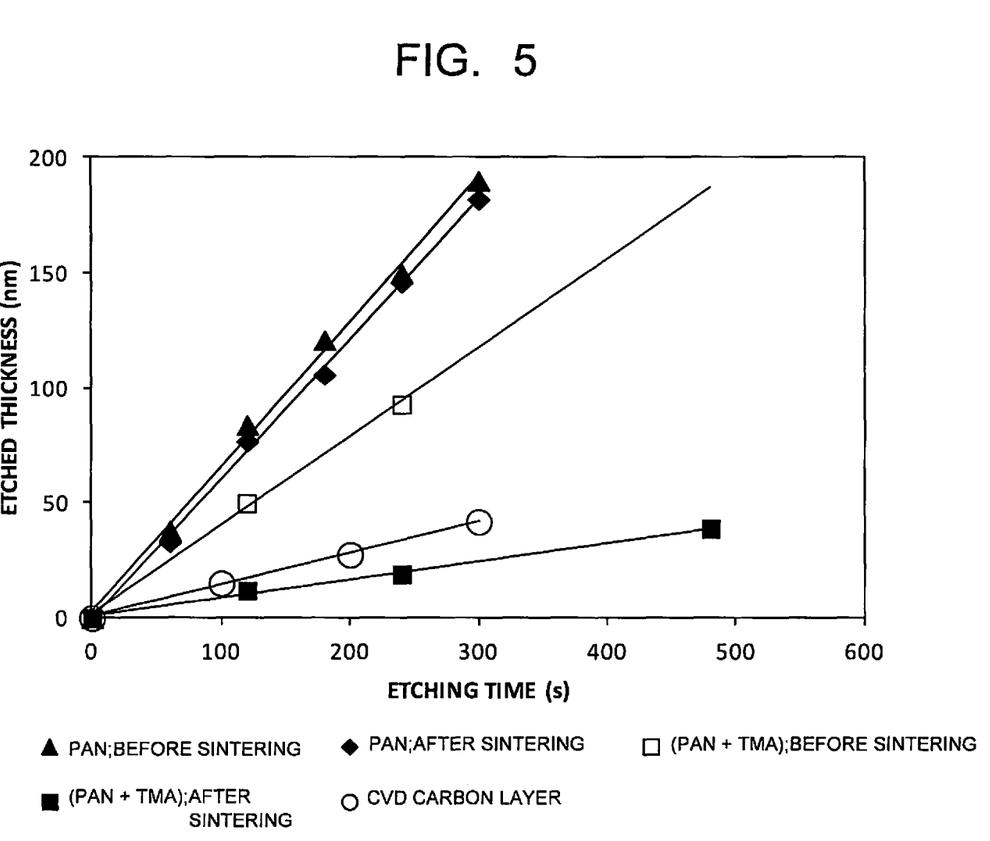
FIG. 5 is a graph illustrating etch resistance of masks obtained in an example.

FIG. 5 illustrates results obtained when a carbon-deposited-layer-attached substrate using a CVD method was etched (in FIG. 5, its measurement point is illustrated as "○"), the sample substrate for a metallization process was etched (the organic-film-attached Si substrate; in FIG. 5, its measurement point is illustrated as "▲"), a sample substrate obtained by heating the sample substrate for a metallization process similarly to the above was etched (a heat-treated-organic-film-attached Si substrate; its measurement point is illustrated as "◆"), and the metallized sample substrate for a metallization process was etched (the composite-film-attached Si substrate; its measurement point is illustrated as "☐") similarly.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    forming an organic film containing polyacrylonitrile on a target film on a semiconductor substrate;
    applying a metal compound to the organic film to form a composite film;
    removing the composite film partially to form a pattern;
    heating the pattern-formed composite film; and
    processing the target film by using the heated composite film as a mask.

2. The method of manufacturing the semiconductor device according to claim 1, wherein
    a temperature in the heating is 200° C. or more and less than 1000° C.

3. The method of manufacturing the semiconductor device according to claim 1, wherein
    a temperature in the heating is 200° C. or more and less than 600° C.

4. The method of manufacturing the semiconductor device according to claim 1, further comprising:
    before the heating, embedding a core material in a portion from which the composite film is removed in the forming the pattern and after the heating, removing the core material.

5. The method of manufacturing the semiconductor device according to claim 1, wherein
    the composite film is formed by applying a precursor of the metal compound to the organic film, and applying an oxidant to the organic film including the precursor.

6. The method of manufacturing the semiconductor device according to claim 5, wherein
    the a precursor of the metal compound includes at least one selected from the group consisting of $AlCl_3$, $TiCl_4$, $WCl_6$, $VCl_4$, $HfCl_4$, $ZrCl_4$ and trimethylaluminum.

7. The method of manufacturing the semiconductor device according to claim 1, wherein
    the heated composite film contains a structure in which a cyano group of polyacrylonitrile is cyclized and a metal compound is coordinated to a nitrogen atom of the cyclized cyano group.

8. The method of manufacturing the semiconductor device according to claim 1, wherein
    the heated composite film contains a structure represented by the following chemical formula (P3),

[Chemical formula 1]

(P3)

wherein MX represents a metal compound, m/2 represents an integer of two or more, and . . . represents a coordinate bond.

9. The method of manufacturing the semiconductor device according to claim 1, wherein the removing of the composite film partially is performed by etching.

10. The method of manufacturing the semiconductor device according to claim 1, wherein the organic film is produced by use of organic solvent and polymer containing acrylonitrile.

11. The method of manufacturing the semiconductor device according to claim 1, wherein a content ratio of acrylonitrile to polyacrylonitrile in the organic film is 90 to 100 mol %.

12. A method of forming a pattern film, comprising:
    forming an organic film containing polyacrylonitrile;
    applying a metal compound to the organic film to form a composite film;
    removing the composite film partially to form a pattern; and
    heating the pattern-formed composite film.

13. The method of forming the pattern film according to claim 12, wherein a temperature in the heating is 200° C. or more and less than 1000° C.

14. The method of forming the pattern film according to claim 12, wherein
    a temperature in the heating is 200° C. or more and less than 600° C.

15. The method of forming the pattern film according to claim 12, further comprising:
    before the heating, embedding a core material in a portion from which the composite film is removed in the forming the pattern and after the heating, removing the core material.

16. The method of forming the pattern film according to claim 12, wherein
    the composite film is formed by applying a precursor of the metal compound to the organic film, and applying an oxidant to the organic film including the precursor.

17. The method of forming the pattern film according to claim 16, wherein
    the a precursor of the metal compound includes at least one selected from the group consisting of $AlCl_3$, $TiCl_4$, $WCl_6$, $VCl_4$, $HfCl_4$, $ZrCl_4$ and trimethylaluminum.

18. The method of forming the pattern film according to claim 12, wherein
    the heated composite film contains a structure in which a cyano group of polyacrylonitrile is cyclized and a metal compound is coordinated to a nitrogen atom of the cyclized cyano group.

19. The method of forming the pattern film according to claim 12, wherein
    the heated composite film contains a structure represented by the following chemical formula (P3),

[Chemical formula 2]

(P3)

wherein MX represents a metal compound, m/2 represents an integer of two or more, and . . . represents a coordination bond.

20. The method of forming a pattern film according to claim 12, wherein the removing of the composite film partially is performed by etching.

21. The method of forming a pattern film according to claim 12, wherein the organic film is produced by use of organic solvent and polymer containing acrylonitrile.

22. The method of forming a pattern film according to claim 12, wherein a content ratio of acrylonitrile to polyacrylonitrile in the organic film is 90 to 100 mol %.

23. A metal-containing organic film containing a structure in which a cyano group of polyacrylonitrile is cyclized and a metal compound is coordinated to a nitrogen atom of the cyclized cyano group.

24. The metal-containing organic film according to claim 23, containing a structure represented by the following chemical formula (P3),

[Chemical Formula 3]

(P3)

wherein MX represents a metal compound, m/2 represents an integer of two or more, and . . . represents a coordinate bond.

25. The metal-containing organic film according to claim 24, wherein m/2 in the chemical formula (P3) is 10 or more.

* * * * *

UNITED STATES PATENT AND TRADEMARK OFFICE
CERTIFICATE OF CORRECTION

PATENT NO. : 11,177,129 B2
APPLICATION NO. : 16/562709
DATED : November 16, 2021
INVENTOR(S) : Norikatsu Sasao et al.

It is certified that error appears in the above-identified patent and that said Letters Patent is hereby corrected as shown below:

In the Claims

In Claim 6, Column 17, Line 54, "the a precursor" should read --the precursor--.

In Claim 17, Column 18, Line 55, "the a precursor" should read --the precursor--.

Signed and Sealed this
Twenty-fourth Day of May, 2022

Katherine Kelly Vidal
*Director of the United States Patent and Trademark Office*